United States Patent
Kraus et al.

(10) Patent No.: US 12,411,421 B2
(45) Date of Patent: Sep. 9, 2025

(54) METROLOGY APPARATUS BASED ON HIGH HARMONIC GENERATION AND ASSOCIATED METHOD

(71) Applicant: ASML Netherlands B.V., Veldhoven (NL)

(72) Inventors: Peter Michael Kraus, Amsterdam (NL); Sylvianne Dorothea Christina Roscam Abbing, Utrecht (NL); Filippo Campi, Amsterdam (NL); ZhuangYan Zhang, Berlin (DE); Petrus Wilhelmus Smorenburg, Veldhoven (NL); Nan Lin, Eindhoven (NL); Stefan Michiel Witte, Hoofddorp (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 183 days.

(21) Appl. No.: 18/253,734

(22) PCT Filed: Oct. 28, 2021

(86) PCT No.: PCT/EP2021/079956
§ 371 (c)(1),
(2) Date: May 19, 2023

(87) PCT Pub. No.: WO2022/111935
PCT Pub. Date: Jun. 2, 2022

(65) Prior Publication Data
US 2024/0004312 A1    Jan. 4, 2024

(30) Foreign Application Priority Data

Nov. 30, 2020  (EP) ..................................... 20210697
Mar. 29, 2021  (EP) ..................................... 21165644

(51) Int. Cl.
*G03F 7/00* (2006.01)
*G02F 1/35* (2006.01)
*H05G 2/00* (2006.01)

(52) U.S. Cl.
CPC ........ *G03F 7/70641* (2013.01); *G02F 1/3505* (2021.01); *G02F 1/3507* (2021.01);
(Continued)

(58) Field of Classification Search
CPC ...... G02F 1/3505; G02F 1/3507; G02F 1/353; G03F 7/70025; G03F 7/70616;
(Continued)

(56) References Cited

U.S. PATENT DOCUMENTS 6,327,294 B1 * 12/2001 Kojima .................. H01S 3/109
                                                          372/101
6,952,253 B2    10/2005 Lof et al.
(Continued)

FOREIGN PATENT DOCUMENTS

CN          101515105 B     8/2009
EP          1 628 164 A2    2/2006
(Continued)

OTHER PUBLICATIONS

International Search Report and Written Opinion of the International Searching Authority directed to International Patent Application No. PCT/EP2021/079956, mailed Feb. 11, 2022; 13 pages.
(Continued)

*Primary Examiner* — Deoram Persaud
(74) *Attorney, Agent, or Firm* — Sterne, Kessler, Goldstein &Fox P.L.L.C.

(57) ABSTRACT

Disclosed is a metrology apparatus for measurement of a target formed on a substrate by a lithographic process and associated method. The metrology apparatus comprises a radiation source operable to provide first radiation; a con-
(Continued)

figured solid high harmonic generation medium being configured to receive and be excited by said first radiation to generate high harmonic second radiation from an output surface of the configured solid high harmonic generation medium; and a detection arrangement operable to detect said second radiation, at least a portion of which having been scattered by said target. The configured solid high harmonic generation medium is configured to shape the beam of said second radiation and/or separate said first and second radiation.

14 Claims, 6 Drawing Sheets

(52) U.S. Cl.
CPC ........ *G02F 1/353* (2013.01); *G03F 7/706849* (2023.05); *H05G 2/00* (2013.01); *H05G 2/001* (2013.01)

(58) Field of Classification Search
CPC . G03F 7/70641; G03F 7/706849; H05G 2/00; H05G 2/001
See application file for complete search history.

(56) References Cited

U.S. PATENT DOCUMENTS

| | | | |
|---|---|---|---|
| 6,961,116 | B2 | 11/2005 | Den Boef et al. |
| 7,265,364 | B2 | 9/2007 | Teunissen et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 11,626,704 | B2 | 4/2023 | Van Der Post et al. |
| 2005/0041702 | A1* | 2/2005 | Fermann ............ B23K 26/0622 372/25 |
| 2007/0224518 | A1 | 9/2007 | Yokhin et al. |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0140009 | A1 | 6/2011 | Kaertner et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0304424 | A1 | 11/2013 | Bakeman et al. |
| 2014/0019097 | A1 | 1/2014 | Bakeman et al. |
| 2015/0261097 | A1 | 9/2015 | Mathijssen et al. |
| 2016/0149371 | A1* | 5/2016 | Vampa ................ H01S 5/0604 372/22 |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0184981 | A1 | 6/2017 | Quintanilha et al. |
| 2018/0254597 | A1* | 9/2018 | Van Der Post ....... H01S 3/0085 |
| 2019/0049861 | A1 | 2/2019 | Van Voorst et al. |
| 2020/0350934 | A1* | 11/2020 | Ke ........................ H01Q 23/00 |
| 2022/0390388 | A1* | 12/2022 | Smorenburg ........ H05G 2/0086 |
| 2024/0003809 | A1* | 1/2024 | Kraus ................. G03F 7/70633 |
| 2024/0377765 | A1* | 11/2024 | Smorenburg ....... G03F 7/70616 |

FOREIGN PATENT DOCUMENTS

| | | |
|---|---|---|
| EP | 3 321 739 A1 | 5/2018 |
| JP | 2009-200533 A | 9/2009 |
| TW | 2018-39505 A | 11/2018 |
| WO | WO 2011/012624 A1 | 2/2011 |
| WO | WO 2016/102127 A1 | 6/2016 |
| WO | WO 2019/118934 A1 | 6/2019 |

OTHER PUBLICATIONS

Kraus, Peter M., "Ultrafast extreme-ultraviolet emission from solids," Advanced Research Center for Nanolithography (ARCNL), EUV source workshop, Nov. 4, 2020; 24 pages.
Lemaillet et al., "Intercomparison between optical and x-ray scatterometry measurements of FinFET structures," Proc. SPIE, vol. 8681, Metrology, Inspection, and Process Control for Microlithography XXVII, Apr. 10, 2013; 8 pages.
Zhang et al., "Single-element laser beam shaper for uniform flat-top profiles," Optics Express, vol. 11, No. 16, Aug. 11, 2003; pp. 1942-1948.
Marceau et al., "Second-harmonic frequency-resolved optical gating covering two and a half optical octaves using a single spectrometer," Applied Physics B, vol. 119, Mar. 20, 2015; pp. 339-345.
Fedeli et al., "Structured targets for advanced laser-driven sources," Plasma Physics and Controlled Fusion, vol. 60, Nov. 6, 2017; pp. 1-8.
Ishii et al., "High Harmonic Generation in Reflection and Transmission from Gallium Arsenide," 2019 Conference on Lasers and Electro-Optics (CLEO), May 5, 2019; 2 pages.
Eichmann et al., "Generation of short-pulse tunable xuv radiation by high-order frequency mixing," Physical Review A, vol. 50, No. 4, Oct. 1994; 4 pages.
Taucer et al., "Controlling High Harmonic Generation in Tailored Semiconductors," 2018 Conference on Lasers and Electro-Optics (CLEO), May 13, 2018; 2 pages.

\* cited by examiner

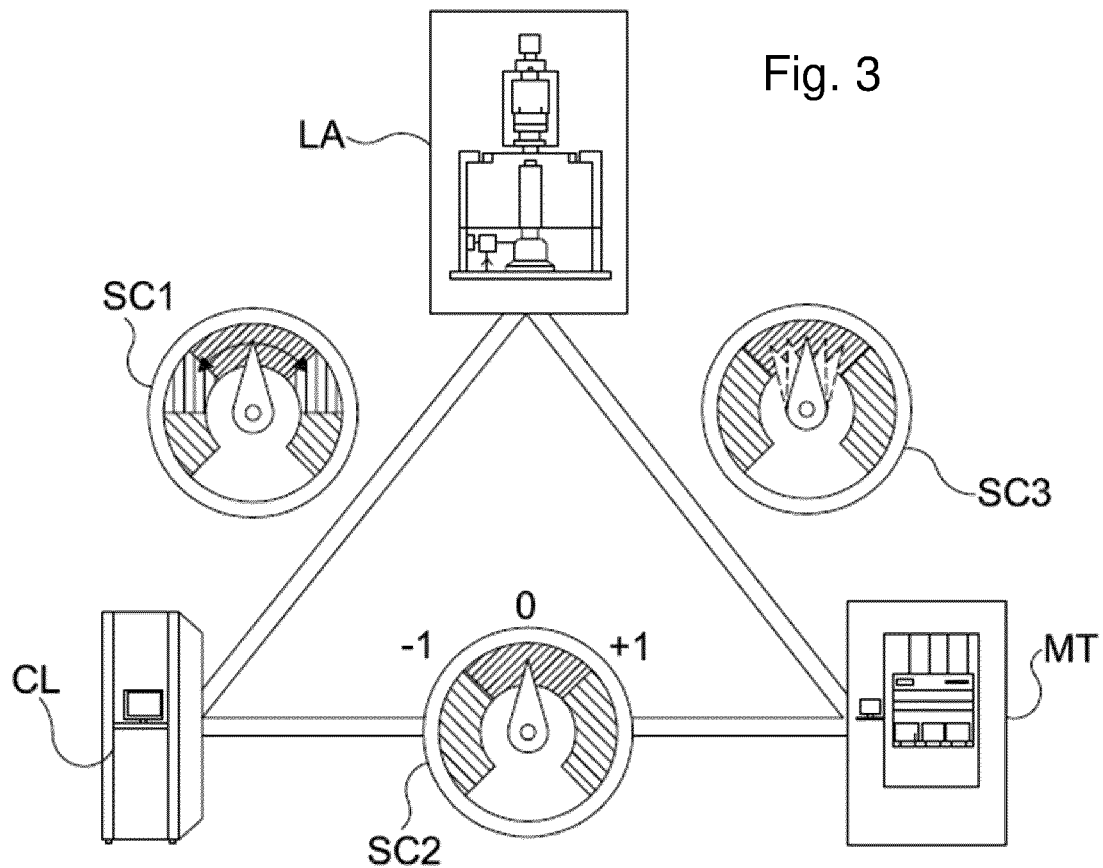
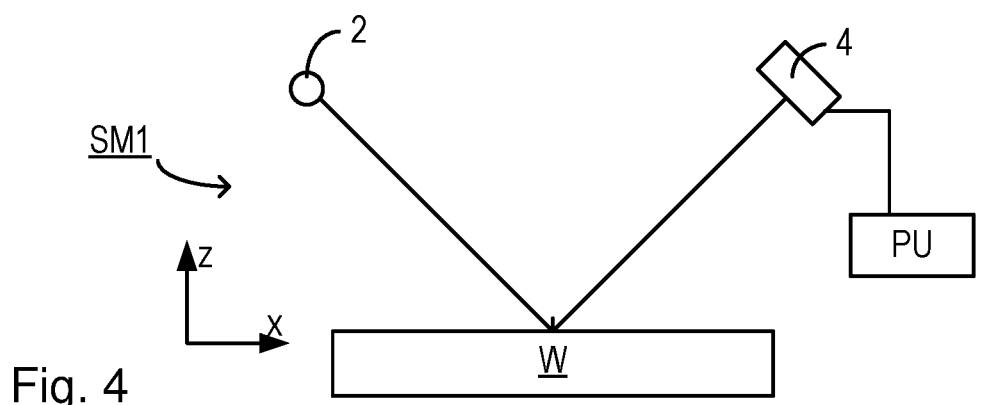
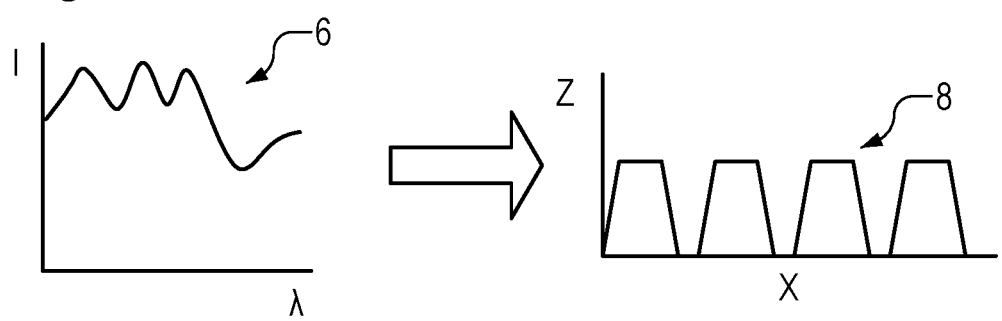

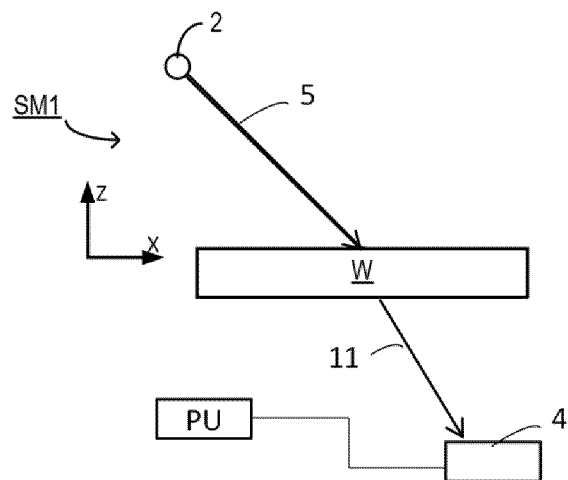
Fig. 5
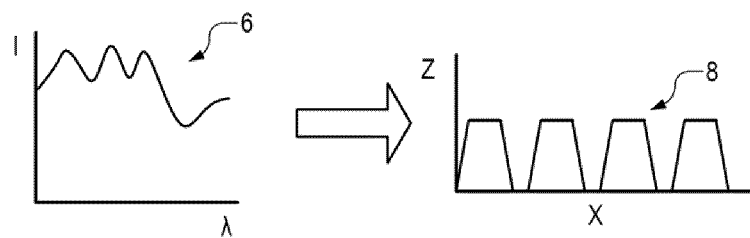
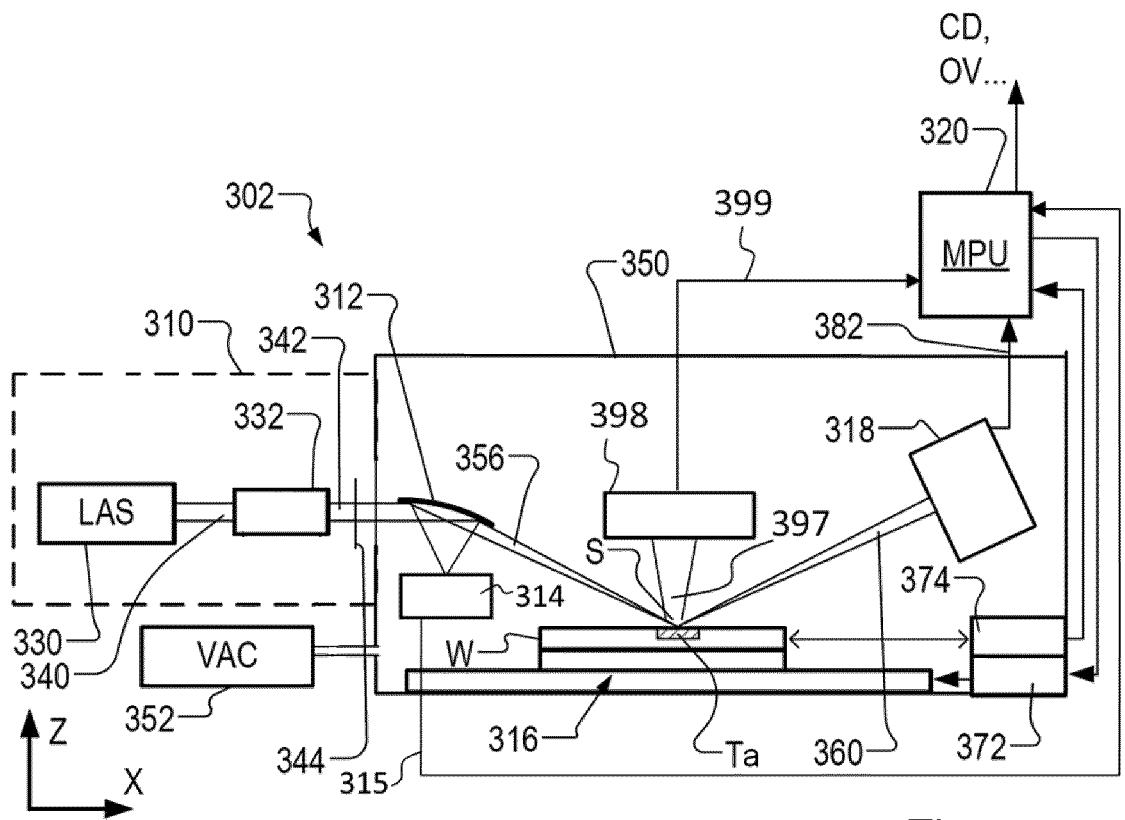
Fig. 6

METROLOGY APPARATUS BASED ON HIGH HARMONIC GENERATION AND ASSOCIATED METHOD

CROSS REFERENCE TO RELATED APPLICATIONS

This application claims priority of EP application 20210697.7 which was filed on 2020 Nov. 30 and EP application 21165644.2 which was filed on 2021 Mar. 29 and whom are incorporated herein in their entirety by reference.

FIELD

The present invention relates to methods and apparatus for metrology usable, for example, in the manufacture of devices by lithographic techniques.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, Such an apparatus may use a wavelength within the range 4-20 nm, for example 6.7 nm or 13.5 nm, to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In so-called reconstruction methods, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures whose properties are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products whose overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards the "soft X-ray" wavelength spectrum), it is possible to resolve smaller structures, to increase sensitivity to structural variations of the structures and/or penetrate further into the product structures. One such method of generating suitably high frequency radiation (e.g., soft X-ray and/or EUV radiation) may be using a pump radiation (e.g., infra-red radiation) to excite a generating medium, thereby generating an emitted radiation, optionally a high harmonic generation comprising high frequency radiation.

However, once generated, delivering the resultant SXR/EUV radiation to the target presents difficulties as it is readily absorbed.

SUMMARY

In a first aspect of the invention, there is provided a metrology apparatus for measurement of a target formed on a substrate by a lithographic process, the metrology apparatus comprising: a radiation source operable to provide first radiation; a configured solid high harmonic generation medium being configured to receive and be excited by said first radiation to generate high harmonic second radiation from an output surface of the configured solid high harmonic generation medium; and a detection arrangement operable to detect said second radiation, at least a portion of which having been scattered by said target; wherein said configured solid high harmonic generation medium is configured to shape the beam of said second radiation and/or separate said first and second radiation.

In a second aspect of the invention, there is provided a configured solid high harmonic generation medium comprising an axicon shape operable to impart an annular profile onto first radiation received at an input surface; and concentric circular grooves on an output surface such that high harmonic second radiation generated at said output surface resulting from excitation by said first radiation is focused on and/or propagates along an optical axis of the configured solid high harmonic generation medium.

In a third aspect of the invention there is provided, a metrology method for measuring a target formed on a substrate by a lithographic process comprising: exciting a configured solid high harmonic generation medium with first radiation, to generate high harmonic second radiation from an output surface of the configured solid high harmonic generation medium and to shape the beam of said second radiation and/or separate said first radiation and said second radiation; and detecting said second radiation, at least a portion of which having been scattered by said target.

In a fourth aspect of the invention, there is provided a configured solid high harmonic generation medium comprising an input surface operable to receive a first radiation; and an output surface operable to emit a high harmonic second radiation resulting from excitation by the first radiation. The configured solid high harmonic generation medium is configured to shape beam of the second radiation and/or separate the first radiation and the second radiation.

BRIEF DESCRIPTION OF THE DRAWINGS

Embodiments will now be described, by way of example only, with reference to the accompanying schematic drawings, in which:

FIG. 3 depicts a schematic representation of holistic lithography, representing a cooperation between three key technologies to optimize semiconductor manufacturing;

FIG. 4 schematically illustrates a scatterometry apparatus;

FIG. 5 depicts a schematic representation of a metrology apparatus in which EUV and/or SXR radiation is used;

FIG. 6 depicts a schematic representation of a metrology apparatus according to embodiments of the invention;

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-125 nm or 5 to 100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
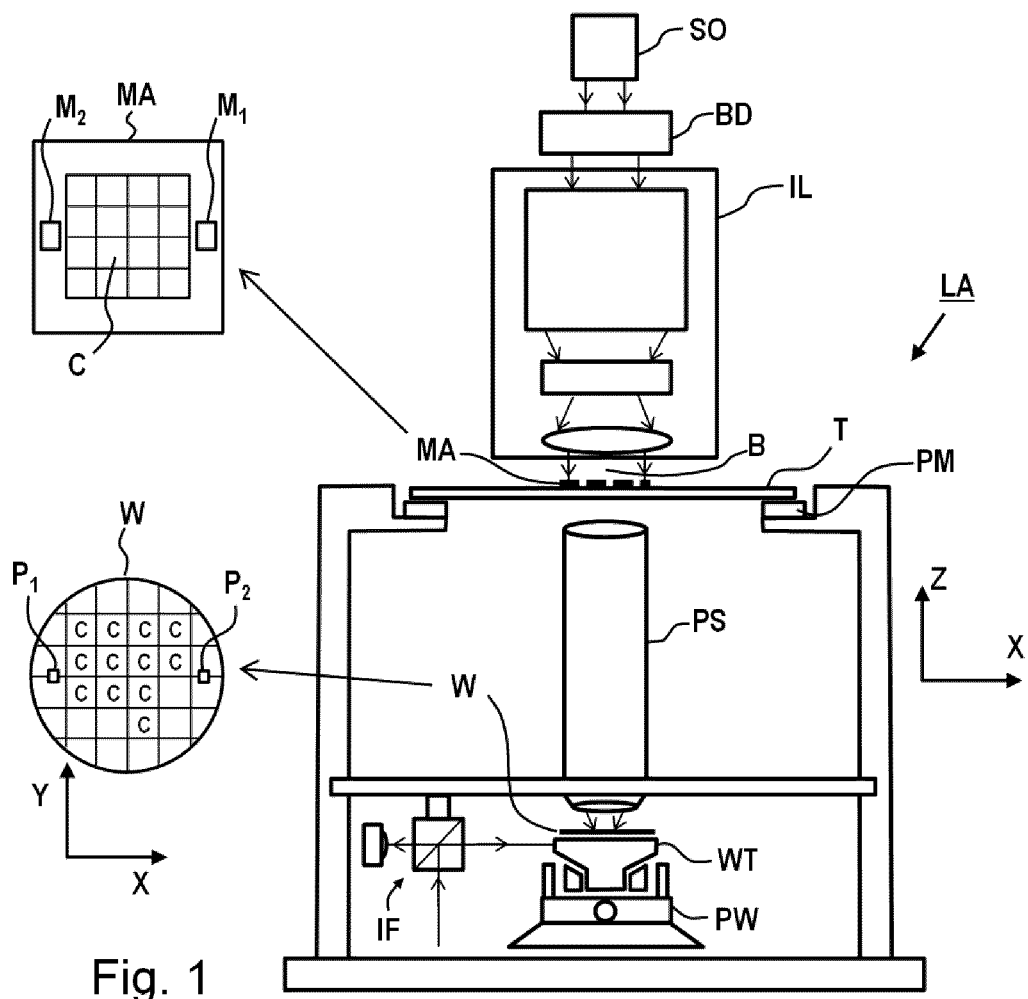
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
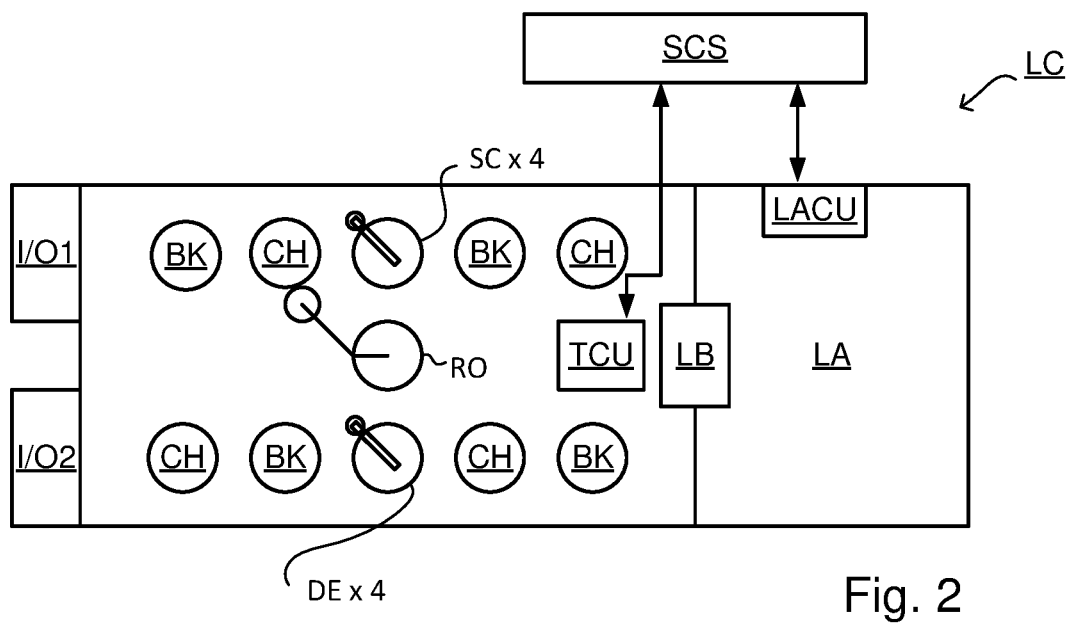
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from hard X-ray, soft X-ray, extreme ultraviolet and visible to near-IR wavelength range. In case that the radiation is hard X-ray or soft X-ray, optionally with a wavelength ranging from 0.01 to 10 nm, the aforementioned scatterometers may optionally be a small-angle X-ray scattering metrology tool.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), shape of structures, etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected, transmitted or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered or transmitted radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard X-ray, soft X-ray, extreme ultraviolet and visible to near-IR wave range.

One example of a metrology apparatus, such as a scatterometer, is depicted in FIG. 4. It may comprise a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use hard X-ray, soft X-rays or EUV radiation, for example radiation in a wavelength range between 0.01 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques may be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

A transmissive version of the example of a metrology apparatus, such as a scatterometer, shown in FIG. 4, is depicted in FIG. 5. The transmitted radiation 11 is passed to a spectrometer detector 4, which measures a spectrum 6 as discussed for FIG. 4. Such a scatterometer may be configured as a normal-incidence scatterometer or an oblique-incidence scatterometer.

It is possible that the range of application makes the use of wavelengths in e.g. the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

SXR metrology (e.g., using wavelengths in the range of 1-100 nm or 30-100 nm) using HHG techniques partially resolve the problem of limited penetration depth of visible/NIR wavelength into the relevant materials, due to the larger penetration depth of SXR. It is also an all-optical method, thus measurements can be sufficiently fast for metrology in a high volume manufacturing environment, for example.

However, handling present HHG sources is technologically challenging. Such sources typically generate high harmonics from excitation of a gas medium, which presents difficulties in handling the gas. Also, HHG generation from gas media require a very high peak-powered drive laser. Furthermore, the setups are inflexible, as there are no good materials for SXR reflection, beam shaping etc. leading to a loss of photons.

In addition, there are no suitable vacuum XUV or EUV sources for metrology presently available (e.g., in the 30-100 nm wavelength range), even though such sources might be similarly beneficial as SXR, but less demanding in vacuum operation (at least for wavelengths greater than 60 nm, i.e., below the ionization threshold of most gases).

As such, a metrology apparatus and associated method is disclosed for measuring a metrology target on a substrate having been formed by a lithographic process, the metrology apparatus being configured to generate SXR or EUV high harmonic measurement radiation from a configured solid medium, wherein the configured solid medium is configured to adjust a property of the emitted measurement radiation such that it is more optimal for said measuring of the metrology target.

FIG. 6 depicts a schematic representation of a metrology apparatus 302 in which radiation in the wavelength range from 0.1 nm to 100 nm may be used to measure parameters of structures on a substrate in accordance with concepts disclosed hereon. The metrology apparatus 302 presented in FIG. 6 is suitable for the soft X-rays or EUV domain.

FIG. 6 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or called illumination source 310, illumination system 312, substrate support 316, detection systems 318, 398 and metrology processing unit (MPU) 320.

An illumination source 310 in this example is for a generation of second radiation; e.g., EUV or soft x-ray radiation, which may be based on high harmonic generation (HHG) techniques. Main components of the radiation source are a pump radiation source 330 operable to emit the pump radiation or first radiation and a configured solid medium 332. Optionally the pump radiation source 330 is a laser, optionally the pump radiation source 330 is a pulsed high-power infrared or visible laser. The pump radiation source 330 may be, for example, a fiber-based laser with an optical amplifier, producing pulses of infrared radiation that may last for example less than 1 ns, less than 1 ps or less that 100 fs per pulse, with a pulse repetition rate up to several megahertz, as required. The wavelength of the infrared radiation may be for example in the region of 1 μm (1 micron). Optionally, the laser pulses are delivered as a first pump radiation 340 to the configured solid medium 332, wherein a portion of the radiation is converted by the configured solid medium 332 to higher frequencies than the first radiation into an emitted radiation 342.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum environment, bearing in mind that SXR radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-100 nm, 1-50 nm, 1-30 nm, 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 may enter an inspection chamber 350 where the substrate W including a structure of interest is held for inspection at a measurement position by substrate support 316. The structure of interest is labeled T. The atmosphere within inspection chamber 350 may be maintained near vacuum by vacuum pump 352, so that generated high harmonic radiation may pass without undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing may be performed to achieve a round or elliptical spot S under 10 μm in diameter, when projected onto the structure of interest (e.g., to measure 10 μm×10 μm targets; however the concepts herein may be used to measure larger targets comprising dimensions of 20 μm, 30 μm, 40 μm or 50 μm in one or both of the substrate plane dimensions).

In some embodiments, however, the focusing may be performed by the configured solid medium 332 and no curved mirror may be required.

Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 6, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 6 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

Figure 7:
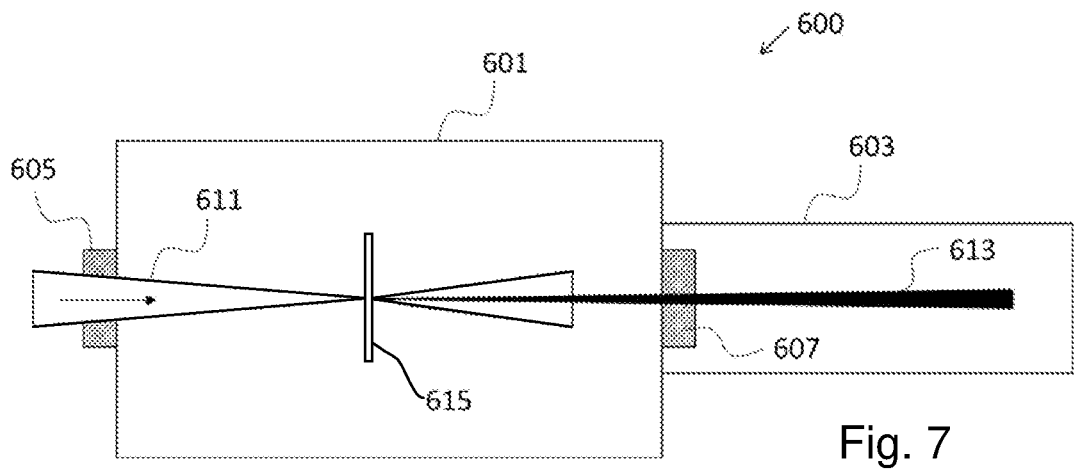
FIG. 7 depicts a schematic representation of a first illumination source for high harmonic generation usable in metrology devices according to embodiments of the invention.

FIG. 7 shows a simplified schematic drawing of an embodiment 600 of an illumination source 310, which may be the illumination source for high harmonic generation. One or more of the features of the illumination source in the metrology tool described with respect to FIG. 7 may also be present in the illumination source 600 as appropriate. The illumination source 600 may comprise a chamber 601. The illumination source 600 is configured to receive first radiation or pump radiation 611 with a propagation direction which is indicated by an arrow. The pump radiation 611 shown here is an example of the pump radiation 340 from the pump radiation source 330, as shown in FIG. 7. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a solid medium, optionally a configured solid medium 615 within the chamber 601.

The illumination source 600 is configured to provide the pump radiation 611 to the configured solid medium 615 to drive the generation of second radiation or high harmonic emitted radiation 613. In case of generating HHG from a solid medium, the penetration depth of the generated radiation through the solid medium is very short, so that only the radiation generated in a thin layer near the downstream surface will emerge from the medium. Typical penetration depths are on the order of 5-500 nm.

Due to interaction of the pump radiation 611 with the atoms of the configured solid medium 615, the configured solid medium 615 will convert part of the pump radiation 611 into the emitted radiation 613, which may be an example of the emitted radiation 342 shown in FIG. 6. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm. In addition, or alternatively, the emitted radiation 613 may be generated from the lower harmonics of the "high harmonic radiation" (e.g., 3rd, 5th harmonics etc.) such that the emitted radiation comprises wavelengths in the VUV-UV range; e.g., in the range 100 nm to 400 nm.

In operation the emitted radiation 613 beam may pass through a radiation output 607 and may be subsequently manipulated and directed by an illumination system 603, which may be an example of the illumination system 312 in FIG. 6, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 6 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultra-violet (EUV), soft X-Ray (SXR), and/or hard X-Ray part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV and/or SXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUV and/or SXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV and/or SXR radiation. The target structure may reflect and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders. The metrology tool MT may also measure the specular reflected radiation (0th order diffracted radiation). Further sensors for metrology may be present in the metrology tool MT, for example to measure further diffraction orders (e.g. higher diffraction orders).

It is proposed to incorporate together at least one optical element with the generation medium of broadband SXR and/or EUV radiation, by generating the broadband SXR and/or EUV radiation (second radiation) by excitation of a configured medium, e.g., a spatially structured dielectric, using first radiation or drive radiation (e.g., having a wavelength between 100 nm and 3000 nm, between 400 nm and 3000 nm or between 800 nm and 3000 nm).

The frequency up-conversion to multiple harmonics of the fundamental beam has recently been demonstrated in solids. While initially demonstrated in the visible and near ultraviolet spectral region, extreme ultraviolet generation from solids up to 40 eV (30 nm) has recently become possible. The conversion efficiency of the process in solids is lower than for gas phase HHG in the same photon energy range; however, this can be addressed by using intracavity HHG techniques, which would compensate for the comparatively low conversion efficiency. Non-collinear HHG wavemixing in solids is another way to boost the conversion efficiency; e.g., as disclosed by P. M. Kraus in Ultrafast extreme-ultraviolet emission from solids, EUV Source Workshop Proceedings, 04.11.2020. The proceedings are available at https://euvlitho.com/ and are incorporated herein by reference.

In addition, HHG reflection and beam shaping systems have low transmission (reflection) efficiencies due to the poor reflectivity and transmission of materials in this spectral range. By integrating the generating and beam shaping process into a single element, HHG setups become smaller, cheaper, easier to maintain, while possibly retaining the same flux as gas phase systems. Furthermore, HHG beam shaping by structuring the generating solid element allows for far more detailed and high-resolution beam shaping than free-space optics.

Figure 8A:
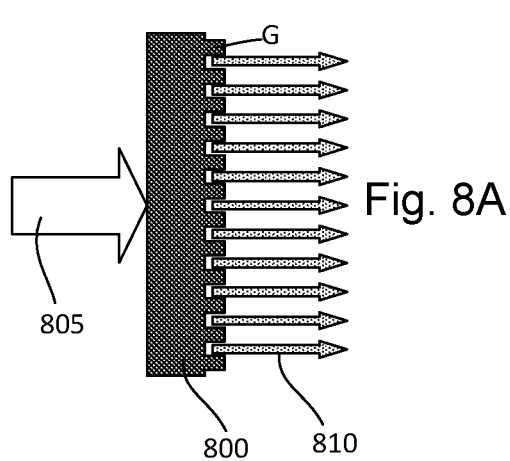
FIGS. 8A and 8B respectively show a configured solid high harmonic generation medium usable in embodiments of the invention, in a first configuration and a second configuration.
Figure 8B:
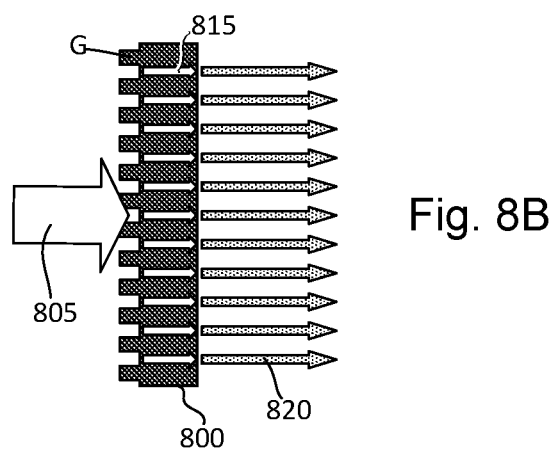

FIG. 8 illustrates a first embodiment of a configured solid HHG medium 800 for generating spatially structured light. A grating structure G is imprinted on a structured side of a fused silica substrate (e.g., in the region of 0.1 mm thick) and HHG is generated from this structure. FIG. 8(a) illustrates the configured solid HHG medium 800 in a first orientation, oriented to receive first radiation or drive radiation 805 on the unstructured side. In this orientation, the HHG occurs on the structured side and a phase grating or phase modulation is imposed on the output SXR/EUV radiation 810; noting that the attenuation length of the extreme ultraviolet radiation is <100 nm and therefore any high harmonics generated more than 100 nm from the output surface will be absorbed within the substrate. FIG. 8(b) illustrates the configured solid HHG medium 800 in a second orientation, oriented to receive first radiation or drive radiation 805 on the structured side. In this orientation, the grating first modulates the drive radiation resulting in modulated drive radiation 815. This modulated drive radiation then causes HHG generation 820 on the unstructured side with a spatially modulated amplitude. This effect can boost the conversion efficiency.

Generating structured light can be interesting for metrology techniques, that rely on projecting a beam with the shape of a grating onto a physical grating on the metrology target (alignment sensor, overlay, level sensor), and for advanced super-resolution imaging techniques like structured illumination microscopy.

FIG. 9 illustrates embodiments of a configured solid HHG medium for generating and focusing the generated light with a single optical element. This would combine the generation medium and focusing optic into a single element, leading to a HHG generation and illumination module that is very compact.

Figure 9A:
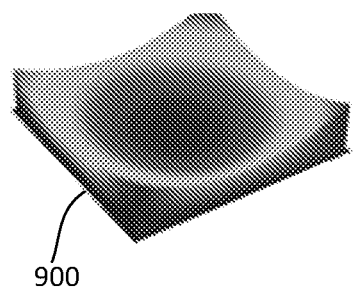
FIGS. 9A and 9B schematically illustrate two different embodiments of a solid high harmonic generation medium which focusses the output radiation.

FIG. 9(a) shows a configured solid HHG medium 900 comprising a curved (concave) outer generation surface which generates and focuses the high harmonic radiation, where the curved surface acts like a lens for the high harmonic radiation.

Figure 9B:
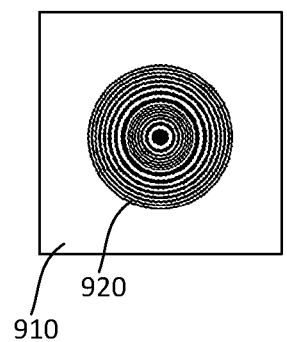

FIG. 9(b) shows a configured solid HHG medium 910 comprising a zone plate; i.e., a flat substrate with non-equidistant concentric grooves 920 on the HHG side (output side). This results in the emission of a convergent, self-focusing HHG beam from the zone plate. More generally, the shape of the output HHG beam depends on the distribution of the grooves of the zone plate. Configure the grooves such that a convergent, self-focusing beam results is only one possible exemplary arrangement, and other groove arrangements are possible depending on the desired beam characteristic(s).

The arrangements of FIGS. 9(a) and (b) may be combined such that the configured solid HHG medium comprises a curved (concave) outer generation surface having thereon a zone plate.

Both the zone plate and curved (concave) outer generation surface will focus the different energies (harmonics) at different locations, which can be a potential benefit, as it enables variation of the spectral intensity on the sample by simply scanning the sample longitudinally through the chromatic focus, which gives additional spectral information of the sample. The downside is that the part of the spectrum that is out of focus may partially lie outside the sample, thereby probing the environment, which is generally regarded as unwanted. However, when scanning the sample, a systematic scan of wavelengths is also performed which probes the environment and provides the potential to identify and discriminate nuisance signal from the environment from the wanted signal from the sample. US patent application 20200201192 describes the benefits of chromatic focus position variation and is incorporated herein by reference.

A few preconditions may be respected to be able to use the concept of a self-focusing high harmonic beam in a realistic high harmonic-based metrology tool. One is that the focal spot of the self-focusing high harmonic beam is sufficiently small to be useful for metrology applications. Metrology targets on wafers may be on the order of or smaller than 50×50 µm, optionally 20×20 µm, optionally 10×10 µm in size (although larger targets may be measured as mentioned above). In one embodiment the focal spot radius $w_0$ may at most be about 5 µm. In general, $w_0$ depends on the distance z from generation point to the focus and on the radius w of the beam at the generation point. To estimate the required beam radius to obtain sufficiently small focal spot radius $w_0$, the high harmonic beam may be modelled as a Gaussian beam. In that case:

$$w \approx \frac{z\lambda}{\pi w_0}$$

with $\lambda$ the high harmonic wavelength. Typically, a clear distance of at least a few cm between the generation medium and the wafer is necessary to allow for insertion of apertures and filters to block the drive laser and prevent it from irradiating the sensitive IC wafer. Taking therefore a safe distance z=10 cm, and a typical wavelength of 30 nm, the above equation yields a w greater than 190 µm. Consequently, the drive laser beam may be at least this size at the position of the solid generation medium, and needs to be sufficiently intense to trigger the emission of high harmonic radiation. Typically, the required intensity may be about $10^{16}$-$10^{17}$ W/m².

A second precondition for applying a self-focusing high harmonic beam in a metrology tool is that the drive laser radiation can be sufficiently blocked from irradiating the sensitive wafer. Very effective blocking may be achieved, for example, by applying a thin-film metal filter. However, such filters cannot withstand a high drive laser power, and therefore in high-power applications an additional blocking step is required before the filter. This additional blocking step may comprise using a laser beam which has an annular profile in a region sufficiently far from the drive laser focus, and blocking this annular beam by means of an aperture. Alternative methods for IR laser blocking may comprise the application of selective mirrors or a mesh grid to block the drive radiation. In any of these methods, it is required to insert optical components in the drive laser beam. For laser intensities common to gas-phase HHG, care has to be taken to place the optical components sufficiently far from the drive laser focus where the flux (i.e., the product of intensity and pulse length) is below the damage threshold of the optical component. In contrast, in solid-phase HHG the drive laser intensity is significantly lower, and optimized high-power optics can be made with damage thresholds comparable to that of the HHG-generating solid itself. Therefore optics damage due to close proximity of the drive laser focus does not present a problem.

Figure 10:
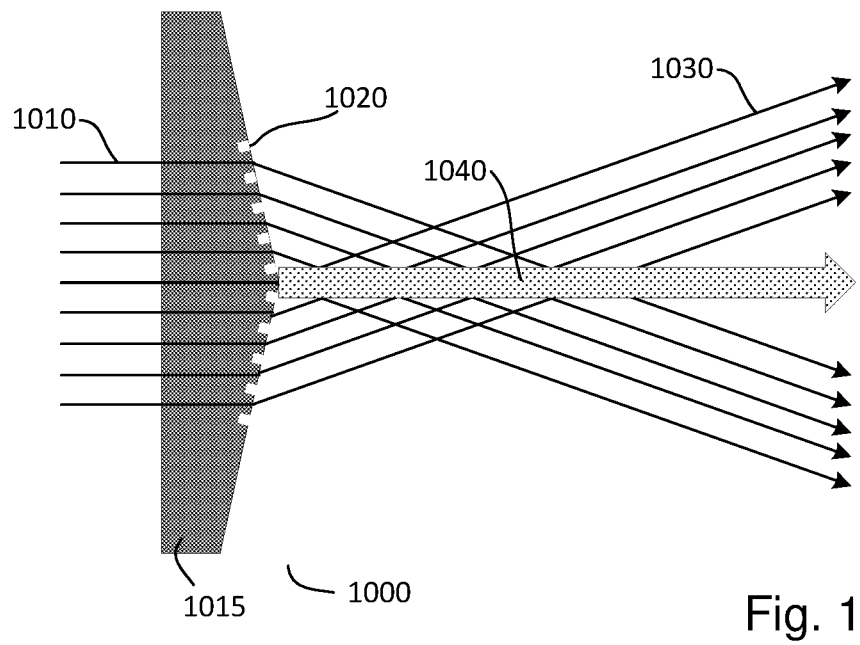
FIG. 10 schematically illustrates an axicon solid high harmonic generation medium according to an embodiment of the invention.

FIG. 10 illustrates embodiments of a configured solid HHG medium 1000 which addresses the problem of filtering out the drive radiation 1010. Such a configured solid HHG medium 1000 can also be used in focusing the high harmonic beam. The configured solid HHG medium 1000 comprises an axicon-shaped solid substrate 1010 comprising concentric circular grooves 1020 on the HHG-generating side (output side). The concentric circular grooves 1020 may, for example, have a form (when viewed along the optical axis) as those of FIG. 9(b). An axicon comprises a conical surface and can convert a laser light beam to an annular distribution. In this context, the axicon shape refracts the IR drive radiation 1010 into an annular beam distribution 1030, while the grooves 1020, assuming a constant groove spacing, diffract the high harmonic radiation 1040 into a collimated beam (substantially) along the optical axis. In another embodiment, the concentric circular grooves 1020 may comprise a Fresnel-type groove spacing which focuses the high harmonic radiation 1040 at a point along the optical axis. In this manner, the drive radiation can be blocked using a suitable dimensioned aperture centered on the optical axis. This element therefore can elegantly combine generation, IR removal and optionally focusing of the high harmonic radiation.

The axicon arrangement described above is only an example of an arrangement for separating the drive radiation from the HHG radiation. More generally, additional embodiments may comprise any configuration in which the shape of the solid is such that the drive radiation is refracted away from the axis, and compensating grooves are provided such that the harmonics are diffracted along the axis. The axicon geometry described above is only one such example of this class of configured solid HHG medium.

Figure 11:
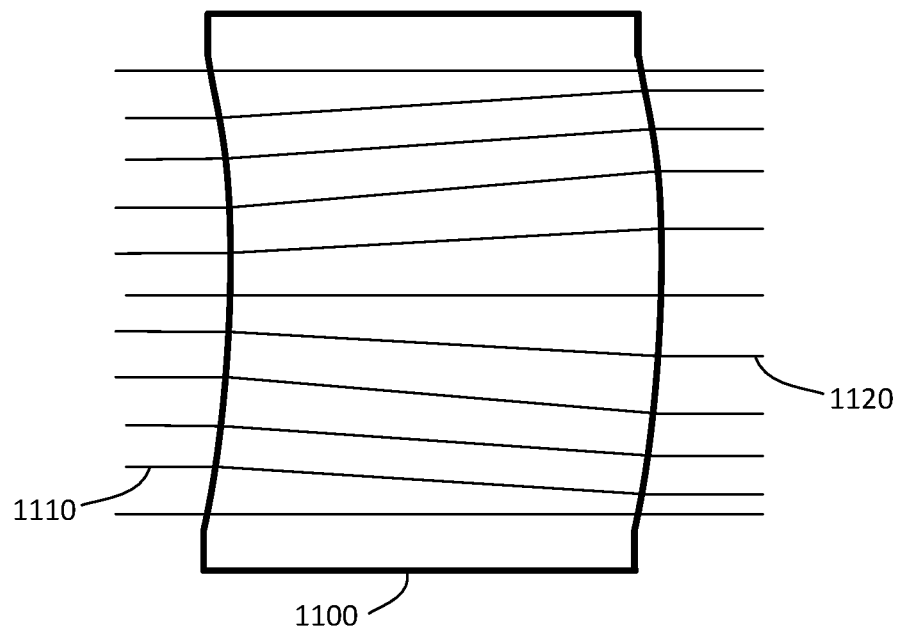
FIG. 11 schematically illustrates a solid high harmonic generation medium for generating a flat-top output beam in an embodiment of the invention.

FIG. 11 illustrates an embodiment of a configured solid HHG medium 1100 for generating flat-top beams (also called top-hat beams). In various metrology applications, it is desired to illuminate the sample with a homogenous intensity profile, in which case a top-hat beam profile may typically be used, i.e., a beam with near-uniform fluence within a circular disk. For visible light, optical elements are readily available (beam shapers) which convert a Gaussian beam into a top hat, but such optical elements are not available for EUV radiation.

The idea behind generating a top-hat high harmonic (e.g., EUV) beam 1120 relies on using a single configured solid HHG element 1100 which imprints a flat-top profile on the fundamental drive radiation beam 1110. This profile is then imprinted on the emitted EUV beam 1120. The actual shape of the optical element 1100 may be similar to that described in Zhang et al, Opt Express 11, 1942 (2003) (disclosed herein by reference). The input surface of the element 1100 refracts the collimated input beam 1110, which is then re-collimated by the output surface. The rays near the optical axis experience larger radial magnification then those further away from the optical axis. This redistributes the intensity of the beam in a uniform flat top distribution.

It should be noted that the generated high harmonic radiation 1120 at the exit surface will experience a different refractive index than that of the infrared driving field. The exit surface has to be shaped such that the EUV beam is turned into a top hat distribution, which will result in a different curvature than in the design consideration by Zhang et al. For example, compared to the design by Zhang et al., the radius of curvature of the exit surface has to be smaller (larger) if the refractive index difference at the exit-surface interface of the emitted high-harmonic radiation is smaller (larger) than the refractive-index difference of the driving laser. The exact design thus follows from the laws of refraction Turning more generally to the topic of separating the drive radiation from the high harmonic radiation, it is expected that the high harmonic radiation and the drive radiation will refract in different directions at a surface, especially when this surface has an angle other than normal incidence, or is curved. This is simply due to the difference in refractive index. And if n>1 for IR but n<1 for EUV, they will actually diffract in opposite directions. This alone may be sufficient for achieving IR/EUV separation, without further need of shaping; a wedge would be sufficient. Subsequently, additional embodiments may further shape and steer the beam(s) as has been described above. As such, the overall shape of any elements disclosed herein may take into account the refractive index, and a wedge may be added as an additional element for separating the high harmonic and drive radiation. Strong variations in the refractive index as a function of photon energy may lead to chromatic aberrations.

Methods described herein may generate radiation with wavelengths shorter than 200 nm, shorter than 160 nm, shorter than 130 nm, shorter than 100 nm, shorter than 80 nm, shorter than 70 nm, shorter than 60 nm, shorter than 50 nm, shorter than 40 nm, shorter than 30 nm or shorter than 20 nm.

As has been mentioned, conversion efficiency is low for HHG generally, and lower for solid-state HHG than for gaseous state HHG. While some of the embodiments described above at least partially address this issue, other embodiments will now be described which use hybrid solid-state HHG and gaseous state HHG methods and arrangements to increase conversion efficiency. These embodiments are disclosed separately and in combination with the embodiments already described. As such, some embodiments may use a configured solid HHG medium in combination with a gaseous HHG medium. However, other embodiments may use a more general (without specific configuration according to the context herein) solid HHG medium in combination with a gaseous HHG medium.

Imaging embedded targets requires confining the light in a small focal distribution, so as to prevent damage and diffraction artifacts from neighboring structures. HHG beams typically exhibit low-intensity, high-divergence components, which lead to diffraction artifacts due to the typically low NA of SXR optics, and are responsible for focal blur in the two following ways During the interaction between a very intense IR pulse and gas atoms, electrons are removed from their parent ions and accelerated as free particles by the laser electric field. As the electric field flips sign, electrons are driven back to the spatial position of the ion, and may recombine. Upon recombination, the acquired energy is emitted as photons. Typically there are two distinct trajectories that lead electrons to recombine with the same photon energy, called "long" and "short". The difference between these two families of trajectories is the amount of time between ionization and recombination, called propagation time. During this propagation in the continuum (i.e., as free electrons), electrons acquire a different intrinsic phase, which is then transferred to the emitted photons. Since such phase is spatially modulated by the intensity distribution across the focal plane, different amplitudes give rise to different phase-front curvatures for long and short trajectories. As a result, each photon energy is the coherent superposition of the emission from two virtual sources, displaced along the optical axis. In order to refocus the generated radiation, a certain plane in the HHG source can be imaged onto the metrology sample, and components originating from a virtual sources located at a different plane will contribute to focal blur.

Additionally, long trajectories acquire the most intrinsic phase, thus leading to the largest divergence. Due to the broad bandwidth generated via HHG, and the low transmission and reflectivity of materials in this spectral range, metallic, grazing incidence optics need to be employed. SXR optics are costly and typically with low-NA (typically a few mrad), which causes the high-divergence components to be clipped by hard edges. This results in scattered photons that may land on unwanted portions of the metrology target.

For these reasons, a technique that optimizes the conversion efficiency while reducing the amount of long trajectories is desirable for a metrology source.

It has been shown that the addition of the second harmonic to the HHG process can both increase the conversion efficiency, and reduce the relative contribution of long trajectories. It has also been shown that the addition of low-order harmonics (mostly third order) of the fundamental to the HHG process increases the conversion efficiency, and favors the short trajectories. This technique is known as seeding.

Typical gas HHG sources require intensities in the $10^{14}$-$10^{15}$ W/cm$^2$ range, while solid-state HHG is a non-destructive technique, and as such it requires intensities below the damage threshold ($10^{13}$ W/cm$^2$). It has been proposed that at this relatively low intensity level, solid-state sources offer higher conversion efficiency than their gaseous counterparts.

It is proposed in this embodiment to use solid-state HHG to seed gas-state HHG so as to improve conversion efficiency, beam profile/quality, and/or amplify structured beam profiles It is proposed to generate harmonics in a gas target (gas high harmonic generation medium) located at or near the focus of a pulsed drive laser, and at the same time to perform HHG in a solid medium (solid high harmonic generation medium), optionally a dielectric medium and/or a nonlinear crystal (e.g., beta barium borate BBO), placed at some distance before the focus (between focus and source). This way, radiation from solid-state HHG interacts with the gas target.

Figure 12:
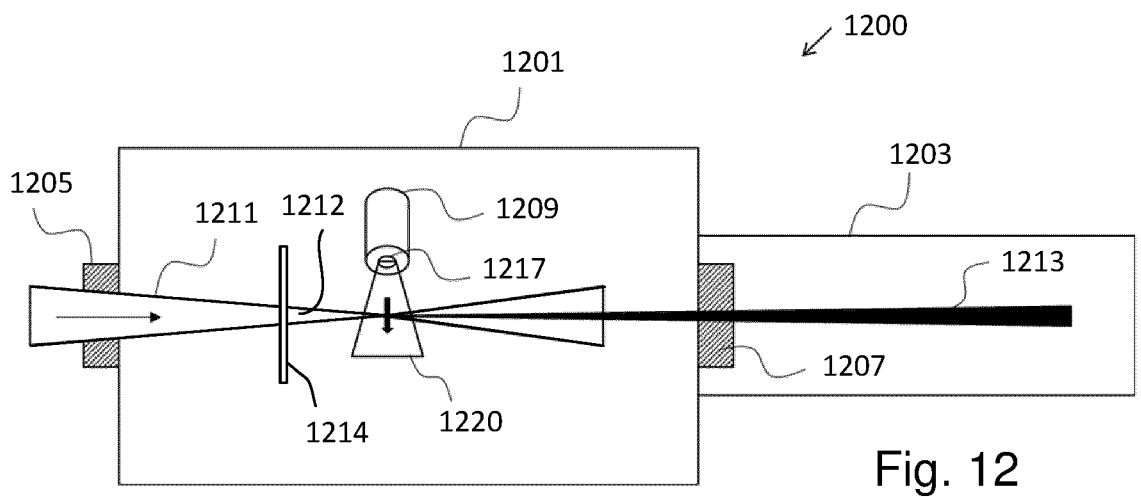
FIG. 12 depicts a schematic representation of a second illumination source for high harmonic generation usable in metrology devices according to embodiments of the invention.

FIG. 12 shows a simplified schematic drawing of an embodiment 1200 of an illumination source for high harmonic generation according to such an embodiment. The illumination source 1200 comprises a chamber 1201. The illumination source 1200 is configured to receive pump radiation 1211 (first radiation) with a propagation direction which is indicated by an arrow. The pump radiation 1211 shown here is an example of the pump radiation 340 from the pump radiation source 330, as shown in FIG. 5. The pump radiation 1211 may be directed into the chamber 1201 through the radiation input 1205, which maybe a viewport which may be made of fused silica or a comparable material. The pump radiation 1211 may have a Gaussian (or hollow, e.g., annular) transversal cross-sectional profile.

The pump radiation 1211 may be incident first on a solid HHG medium 1214. The term solid HHG medium includes any suitable solid-state material for generating high harmonics (including second harmonics and lower harmonics (e.g., third harmonics), and as such also includes non-linear crystal such as BBO. The further pump radiation 1212, which will comprise the transmitted (or reflected depending on configuration) pump radiation 1211 and solid-state HHG radiation (second radiation) generated within solid HHG medium 1214, is subsequently incident, optionally focused, on a gas flow 1220, which has a flow direction indicated by a second arrow, within the chamber 1201. The gas flow 1220 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 1220 may be a steady flow. Other media, such as metallic plasmas (e.g. aluminum plasma) may also be used. Note that the gas flow arrangement is only one example out of many possible arrangements. The example shown is a gas jet (flow of gas perpendicular to the laser beam), while other commonly used geometries include gas cells (enclosure containing gas with apertures/windows for the laser beam to pass) and capillaries (tube-like enclosure filled with gas which guides the laser beam).

Along the propagation direction of the Gaussian beam of pump radiation 1211, 1212 to its waist, the peak intensity varies as a function of the distance from the focal plane of the pump radiation 1211, 1212. Assuming a target intensity of $10^{15}$ W/cm$^2$ in focus, a level of $10^{13}$ W/cm$^2$ is reached at a few Rayleigh ranges (e.g., between three and ten) before the focus. This defines two well-separated regions where the intensity is optimal for each of gas-state HHG or solid-state HHG, within the same focusing geometry. As such, the arrangement may be such that the gas target (gas HHG medium) 1220 is at or near the focal plane of the pump radiation 1211 (e.g., near the focal plane in the context of this disclosure may comprise being within three, two or one Rayleigh ranges of the focal plane) and the solid HHG medium 1214 is located between the pump source and this focal plane, e.g., at a location between three and ten Rayleigh ranges from the focal plane.

The HHG mechanism in solids does not introduce any significant additional intrinsic phase, and therefore the curvature of the phase-front of the pump radiation 1211 is transferred to the harmonic generated in the solid HHG medium 1214. This harmonic (solid-state high harmonic generated radiation) may be focused at the same focal plane as the pump radiation 1211, 1212.

The gas delivery system of the illumination source 1200 is configured to provide the gas flow 1220. The region where at least a majority of the emitted radiation 1213 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 1220 is provided by the gas delivery system into an evacuated or nearly evacuated space.

The gas delivery system may comprise a gas nozzle 1209, as shown in FIG. 12, e.g., which comprises an opening 1217 in an exit plane of the gas nozzle 1209. The gas flow 1220 is provided from the opening 1217. In almost all the prior arts, the gas nozzle has a cut tube geometry shape which is a uniform cylinder interior geometry shape, and the shape of the opening in the exit plane is round. An elongated opening has also been used as described in the patent application CN101515105B.

In operation the emitted radiation 1213 beam may pass through a radiation output 1207 and may be subsequently manipulated and directed by an illumination system 1203, which may be an example of the illumination system 312 in FIG. 5, to a wafer to be inspected for metrology measurements. The emitted radiation 1213 may be guided, optionally focused, to a target on the wafer.

In solid-state HHG, the symmetry of the crystal determines the generated spectrum. Materials possessing inversion symmetry can efficiently generate even harmonics, including the second harmonic. Any material can generate odd harmonics, thus making it possible to seed gas-HHG. As such, in an embodiment, the solid HHG material may have a crystal symmetry suitable for generating a second harmonic (second harmonic second radiation), in addition to odd harmonics (e.g., third harmonic second radiation); e.g., generates both second and third harmonics. However this is optional and improvement over the present state of the art will be obtained if the solid HHG material generates only one or more odd harmonics.

Figure 13:
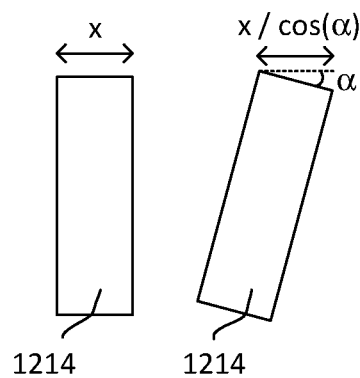
FIG. 13 depicts a solid HHG medium of the arrangement of FIG. 12 in two tilt configurations illustrating a method of controlling a path length within the solid HHG medium.

Efficient generation of seed harmonics in the solid sample is not necessarily enough to grant control over the seeding process. Sufficiently precise sub-cycle synchronization of the driving pulses with the generated low harmonic can also be important. In an embodiment, precise timing may be achieved by tilting the angle of the solid HHG sample 1214 as illustrated in FIG. 13, thereby providing a high precision control of the effective thickness or path length of the solid HHG medium in the pump propagation path. By actuating a rotation of the solid HHG medium, the path length is increased by a geometrical factor, thus increasing the delay due to the group dispersion.

Harmonics generated in the solid HHG medium will experience a temporal walkoff, as compared to the fundamental pulse, due to the group dispersion in the material. This effect is not expected to be detrimental to the applicability of the concepts disclosed herein, provided that the thickness or length of the sample is small enough such that the temporal walkoff is less than the duration of the fundamental pulse (e.g., for a 50 fs pulse in silicon dioxide, this corresponds to about 100 µm).

The solid HHG medium may comprise a varying thickness along a direction perpendicular to the pump radiation propagation direction e.g., a wedge shape. By actuating a lateral translation of such a wedge shaped medium along a direction perpendicular to the pump radiation propagation direction, the effective length of the generation medium is varied, and therefore the effective delay between the driving pulse and the seed harmonics.

The fact that the same pulses which generate seed harmonics propagate through tens to a hundred microns of the solid HHG material leads to nonlinear effects, such as self-phase modulation and self-focusing/defocusing, which may result in a sub-optimal spectral and temporal shape of the driving pulse available for high harmonic generation (e.g., to generate SXR) in the gas target. To address this, another embodiment proposed performing the solid-state HHG in reflection. This has been shown to yield similar spectra as compared to generation in transmission, and has been observed to be more efficient.

Figure 14:
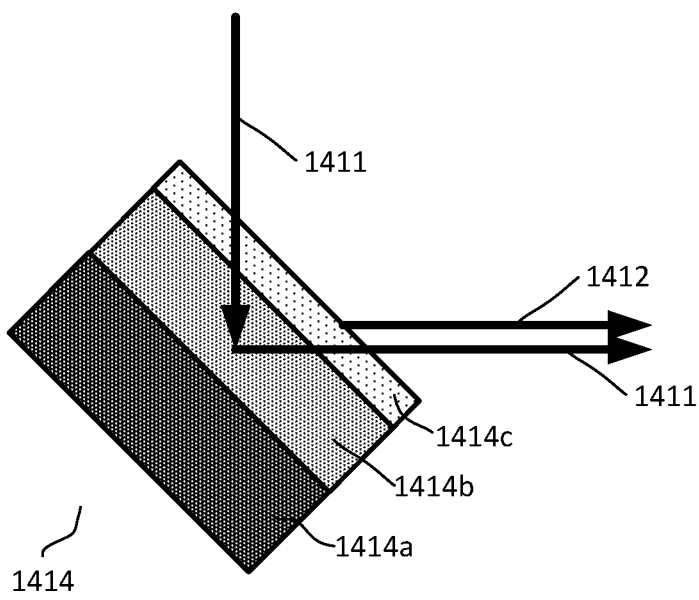
FIG. 14 depicts a reflective solid HHG medium usable within the basic arrangement of FIG. 12.

FIG. 14 schematically illustrates a solid HHG medium 1414 usable in such an embodiment. An optical blank 1414a may be coated with an appropriate high-reflection (HR) layer 1414b, e.g., a low-dispersion, multilayered HR stack. On top of this HR layer 1414b, is a generating layer (HHG layer) 1414c, e.g. a thin-film coating. Incident on the solid HHG medium 1414 is the pump radiation 1411, which is reflected by the HR layer 1414b, while also generating high harmonic radiation (seed harmonics) 1412 in the HHG layer 1414c.

The thickness of the generating layer can be precisely optimized to achieve synchronization of the fundamental beam 1411 (reflected by the HR layer 1414b) and the seed harmonics 1412. The thickness profile may be modulated across the surface to provide fine adjustment of the synchronization, by tuning the lateral position where the pump radiation beam impinges on the sample. As such, and analogously to the example described in relation to FIG. 13, an additional method for fine-tuning of the synchronization may comprise varying the angle of incidence. Optionally, an additional mirror, such as for example in a retroreflector arrangement, may be used to accomplish this while maintaining the alignment of the beam path.

The material of the top layer may be integrated within the HR structure (e.g., silicon dioxide is often used in such structures), and/or can be chosen to optimize emission of the seed harmonics. A relatively low-bandgap material may be used, such that it is transparent to the fundamental wavelength but not to its low harmonics. In this case, harmonics generated in the top layer are reabsorbed, the pump pulse is reflected by the HR coating and generates harmonics on the way out of the multilayer stack. In this way, the synchronization between fundamental and harmonics is intrinsically achieved. Thin-film layers typically have higher damage thresholds compared to the same bulk material, which is an additional benefit.

Another embodiment may comprise generating the second harmonic and lower harmonics (e.g., third harmonic) separately prior to said gas-state HHG.

In such an embodiment, the second harmonic of the fundamental may be generated within a suitable nonlinear crystal solid HHG medium (e.g. beta barium borate BBO), prior to performing HHG in the cascaded solid-HHG setup described above (e.g., in relation to FIGS. 12 to 14). This ensures high conversion efficiency, and increased control over the polarization state and synchronization. As such, a first solid HHG medium (e.g., the nonlinear crystal medium) may be used to generate the second harmonic radiation from the pump radiation and a second solid HHG medium may be used to generate the seed harmonics (e.g., third harmonic) from the second harmonic radiation (and pump radiation). These seed harmonics and transmitted/reflected pump radiation (and possibly any transmitted/reflected second harmonic radiation) excite the gas HHG medium to generate the output HHG. The inventors have demonstrated that the addition of a second harmonic pulse to the solid-state HHG process boosts the conversion efficiency by a large factor. This leads to a strong emission of low harmonics, which can seed the gas-state HHG.

All the previously described hybrid embodiments are in-line arrangements and therefore no interferometer is needed, thus improving stability. However, an interferometer arrangement may be used to implement a seeding scheme, wherein different wavelengths (e.g., fundamental, 2nd harmonic, 3rd harmonic) are separated into two or more different beam paths to enable independent manipulation, for example tuning the delay of an individual wavelength, after which the wavelengths are recombined. A fundamental pulse may be sent through a second harmonic generating crystal. The timing of the fundamental and the cross-polarized second harmonic may be adjusted by introducing a birefringent material (e.g., calcite) to compensate for temporal walkoff in the BBO and through air. Another nonlinear crystal may be used to generate the sum frequency, i.e., third harmonic of the fundamental. The third harmonic may then be separated by means of a beamsplitter. In one arm of the interferometer a delay line can compensate for any delay between ω+2ω and the 3ω pulses, which are then recombined with another beam splitter. The three wavelengths may then be focused on the gas HHG medium.

As already mentioned, all these hybrid embodiments may be modified to incorporate the techniques described the earlier embodiments (e.g., those described in relation to FIGS. 8 to 11). In this way, it is possible to structure the drive laser beam and the harmonics generated in the solid HHG medium(s) in a manner so as to optimize the seeding effect into the gas HHG medium.

For example, by generating harmonics in an axicon solid HHG medium such as described in relation to FIG. 10, comprising concentric grooves (Fresnel-type), it is possible to overlap the pump laser in the focus of the axicon solid HHG medium with the focus of its third harmonic. The shape of the axicon will determine the focusing properties, and the spacing of the grooves will determine the focusing properties of the generated third harmonic, thus making seeding possible.

By way of another example, it may be advantageous to pattern the emission from solid-state HHG by generating a flat-top seeding beam, e.g., using a solid HHG medium as illustrated by FIG. 11 and/or the accompanying text. The resulting smooth in-focus distribution is expected to increase the conversion efficiency of HHG in the gas target via improved-phase matching.

In an embodiment, the seed harmonics may be generated in a dielectric grating solid HHG medium. In this manner, the structure, imprinted in the generated radiation, can be transferred to the gas HHG medium. By imaging the gas HHG medium onto a lithographic structure (e.g., an overlay target), it is possible to perform overlay metrology.

An alternative way to apply the concept of this embodiment, would be to decrease the driving intensity to achieve the same yield. This also amounts to an increase in conversion efficiency: if the pump laser comprises a tunable laser the energy per pulse may be decreased and the repetition rate increased. Typically, this scaling increases the average power of the laser.

Should the repetition rate not be a tunable parameter, or its increase would not result in an increase of average power, the peak intensity may still be decreased by adopting a looser focusing geometry. While this would not result in increased conversion efficiency, it would reduce the overall divergence of the SXR source and it becomes possible to find the best tradeoff between conversion efficiency and divergence.

The illumination source may be provided in for example a metrology apparatus MT, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent numbered clauses:

1. A metrology apparatus for measurement of a target formed on a substrate by a lithographic process, the metrology apparatus comprising:
   a radiation source operable to provide first radiation;
   a configured solid high harmonic generation medium being configured to receive and be excited by said first radiation to generate high harmonic second radiation from an output surface of the configured solid high harmonic generation medium; and
   a detection arrangement operable to detect said second radiation, at least a portion of which having been scattered by said target;
   wherein said configured solid high harmonic generation medium is configured to shape the beam of said second radiation and/or separate said first radiation and said second radiation.
2. A metrology apparatus as claimed in clause 1, wherein said configured solid high harmonic generation medium is configured to focus said second radiation onto said target.
3. A metrology apparatus as claimed in clause 2, wherein said output surface comprises a concave curvature to perform said focusing.
4. A metrology apparatus as claimed in clause 2 or 3, wherein said output surface comprises concentric circular grooves to perform said focusing.
5. A metrology apparatus as claimed in clause 4, wherein said concentric circular grooves comprise a Fresnel spacing arrangement.
6. A metrology apparatus as claimed in any preceding clause, wherein the configured solid high harmonic generation medium comprises a shape which refracts the drive radiation away from an optical axis of the configured solid high harmonic generation medium, and said output surface comprises compensating grooves such that the second radiation is diffracted substantially along the optical axis.
7. A metrology apparatus as claimed in clause 6, wherein the configured solid high harmonic generation medium comprises an axicon shape operable to impart an annular profile onto said first radiation; and concentric circular grooves on the output surface such that said second radiation is focused on and/or propagates substantially along said optical axis of the configured solid high harmonic generation medium.
8. A metrology apparatus as claimed in clause 7, wherein said concentric circular grooves comprise a Fresnel spacing arrangement.
9. A metrology apparatus as claimed in clause 7, wherein said concentric circular grooves are equally spaced apart.

10. A metrology apparatus as claimed in clause 7, 8 or 9, further comprising a spatial filter to block the first radiation and pass the second radiation.

11. A metrology apparatus as claimed in any preceding clause, comprising a grating structure on said output surface being operable to impose a phase modulation on said second radiation.

12. A metrology apparatus as claimed in clause 11, wherein said configured solid high harmonic generation medium is reversible such that, when reversed, said grating structure is comprised on an input surface of said configured solid high harmonic generation medium, and is operable to impose an amplitude modulation on said output radiation.

13. A metrology apparatus as claimed in clause 1, comprising a grating structure on an input surface of said configured solid high harmonic generation medium, being operable to impose an amplitude modulation on said second radiation.

14. A metrology apparatus as claimed in any preceding clause, wherein said configured solid high harmonic generation medium is configured such that it has a curved input surface and curved output surface, and such that refraction of the first radiation at the curved input surface, and refraction of the second radiation at the curved output surface, impart a substantially flat-top illumination profile on said second radiation.

15. A metrology apparatus as claimed in any preceding clause, wherein at least some harmonics of said second radiation comprise wavelengths shorter than 100 nm, optionally shorter than 70 nm.

16. A metrology apparatus as claimed in any preceding clause, wherein at least some harmonics of said second radiation comprise wavelengths shorter than 50 nm.

17. A metrology apparatus as claimed in any preceding clause, wherein the first radiation is pulsed laser radiation.

18. A metrology apparatus as claimed in clause 17, wherein the length of each pulse is in the range of ifs to 500 fs 19. A metrology apparatus as claimed in any preceding clause, wherein the first radiation comprises a wavelength in the range of 100 nm to 3000 nm.

20. A metrology apparatus as claimed in any preceding clause, being configured such that the first radiation is incident on a first side of said substrate and the second radiation is emitted from a second side of said substrate, wherein the first side and the second side are different sides of said substrate.

21. A configured solid high harmonic generation medium comprising an axicon shape operable to impart an annular profile onto first radiation received at an input surface; and concentric circular grooves on an output surface such that high harmonic second radiation generated at said output surface resulting from excitation by said first radiation is focused on and/or propagates substantially along an optical axis of the configured solid high harmonic generation medium.

22. A configured solid high harmonic generation medium as claimed in clause 21, wherein said concentric circular grooves are equally spaced apart to provide a co-linear beam of second radiation.

23. A configured solid high harmonic generation medium as claimed in clause 21, wherein said concentric circular grooves comprise a Fresnel spacing arrangement to perform said focusing.

24. A metrology method for measuring a target formed on a substrate by a lithographic process comprising:

exciting a configured solid high harmonic generation medium with first radiation, to generate high harmonic second radiation from an output surface of the configured solid high harmonic generation medium and to shape the beam of said second radiation and/or separate said first radiation and said second radiation; and detecting said second radiation, at least a portion of which having been scattered by said target.

25. A method as claimed in clause 24, comprising focusing said second radiation onto said target using solid high harmonic generation medium.

26. A method as claimed in clause 25, wherein said output surface comprises a concave curvature to perform said focusing.

27. A method as claimed in clause 25 or 26, wherein said output surface comprises concentric circular grooves to perform said focusing.

28. A method as claimed in clause 27, wherein said concentric circular grooves comprise a Fresnel spacing arrangement.

29. A method as claimed in clause 24 or 25, comprising using the configured solid high harmonic generation medium to refract the drive radiation away from an optical axis of the configured solid high harmonic generation medium, and to diffract the second radiation substantially along the optical axis.

30. A method as claimed in clause 29, wherein the configured solid high harmonic generation medium comprises an axicon shape.

31. A method as claimed in clause 30, wherein said concentric circular grooves comprise a Fresnel spacing arrangement.

32. A method as claimed in clause 30, wherein said concentric circular grooves are equally spaced apart.

33. A method as claimed in clause 30, 31 or 32, further comprising blocking the first radiation and passing the second radiation before said target.

34. A method as claimed in clause 24, comprising imposing a phase modulation on said second radiation using a grating structure on said output surface.

35. A method as claimed in clause 34, comprising selecting an orientation of said high harmonic generation medium is reversible such that, to select whether to impose a phase modulation or amplitude modulation on said output radiation.

36. A method as claimed in clause 24, comprising imposing an amplitude modulation on said second radiation using a grating structure on an input surface of said configured solid high harmonic generation medium.

37. A method as claimed in clause 24, comprising using said solid high harmonic generation medium to impart a substantially flat-top illumination profile on said second radiation.

38. A method as claimed in any of clauses 24 to 37, wherein at least some harmonics of said second radiation comprise wavelengths shorter than 100 nm.

39. A method as claimed in any of clauses 24 to 38, wherein at least some harmonics of said second radiation comprise wavelengths shorter than 70 nm.

40. A method as claimed in any of clauses 24 to 39, wherein at least some harmonics of said second radiation comprise wavelengths shorter than 50 nm.

41 A method as claimed in any of clauses 24 to 40, wherein the first radiation is pulsed laser radiation.

42. A method as claimed in clause 41, wherein the length of each pulse is in the range of 1 fs to 500 fs 43. A method as claimed in any of clauses 24 to 42, wherein the first radiation comprises a wavelength in the range of 100 nm to 3000 nm.

44. A metrology apparatus for measurement of a target formed on a substrate by a lithographic process, the metrology apparatus comprising:
a radiation source operable to provide first radiation;
at least one solid high harmonic generation medium being configured to receive and be excited by said first radiation to generate second radiation via a high harmonic generation process from an output surface of the solid high harmonic generation medium;
a gas source for emitting a gas high harmonic generation medium, the gas high harmonic generation medium being configured to receive said first radiation and said second radiation to generate third radiation via a high harmonic generation process, wherein the at least one solid high harmonic generation medium is located between the radiation source and the gas high harmonic generation medium; and
a detection arrangement operable to detect said third radiation, at least a portion of which having been scattered by said target.

45. A metrology apparatus as claimed in clause 44, wherein the gas high harmonic generation medium is located at or near a focal plane of a beam of said first radiation.

46. A metrology apparatus as claimed in clause 45, wherein the gas high harmonic generation medium is located within three Rayleigh ranges of said focal plane.

47. A metrology apparatus as claimed in clause 45 or 46, wherein the solid high harmonic generation medium is located between three and ten Rayleigh ranges before said focal plane.

48. A metrology apparatus as claimed in clause 45, 46 or 47, operable such that said second radiation is substantially focused at or near said focal plane.

49. A metrology apparatus as claimed in any of clauses 44 to 48, wherein said second radiation comprises second harmonic radiation.

50. A metrology apparatus as claimed in any of clauses 44 to 49, wherein said second radiation comprises third harmonic radiation.

51. A metrology apparatus as claimed in any of clauses 44 to 50, wherein said the solid high harmonic generation medium is tiltably mounted so as to provide a control of the effective thickness or path length of the solid high harmonic generation medium in a propagation direction of the first radiation.

52. A metrology apparatus as claimed in any of clauses 44 to 51, wherein said the solid high harmonic generation medium comprises a varying thickness along a direction perpendicular to said propagation direction of the first radiation, and is laterally translatable.

53. A metrology apparatus as claimed in any of clauses 44 to 52, wherein said the solid high harmonic generation medium comprises a reflective solid high harmonic generation medium.

54. A metrology apparatus as claimed in clause 53, wherein the reflective solid high harmonic generation medium comprises a separate reflective layer and high harmonic generation layer.

55. A metrology apparatus as claimed in clause 53, wherein the reflective solid high harmonic generation medium comprises a reflective high harmonic generation layer having high harmonic generation material integrated in a reflective layer.

56. A metrology apparatus as claimed in clause 54 or 55, wherein the thickness of the high harmonic generation layer is optimized for synchronization of the first radiation and second radiation.

57. A metrology apparatus as claimed in any of clauses 44 to 56, wherein said at least one solid high harmonic generation medium comprises:
a first solid high harmonic generation medium for receiving said first radiation and generating second harmonic second radiation; and
a second solid high harmonic generation medium for receiving at least said second harmonic second radiation and generating third harmonic second radiation for exciting the gas high harmonic generation medium.

58. A metrology apparatus as claimed in clause 57, wherein said first solid high harmonic generation medium comprises a nonlinear crystal solid high harmonic generation medium.

59. A metrology apparatus as claimed in clause 57 or 58, wherein said first solid high harmonic generation medium and second solid high harmonic generation medium are comprised within an interferometer arrangement comprising:
a first beamsplitter operable to separate said third harmonic second radiation from the first radiation and second harmonic second radiation such that said first radiation and second harmonic second radiation is directed to a first interferometer arm and the third harmonic second radiation is directed to a second interferometer arm;
a delay line in one of both of said first and second interferometer arms to enable compensation for any delay between said third harmonic second radiation with respect to said first radiation and second harmonic second radiation; and
a second beamsplitter for recombining said third harmonic second radiation with said first radiation and second harmonic second radiation.

60. A metrology apparatus as claimed in any of clauses 44 to 59, wherein the solid HHG material has a crystal symmetry suitable for generating a second harmonic.

61. A metrology apparatus as claimed in any of clauses 44 to 59, wherein said solid high harmonic generation medium comprises a dielectric grating.

62. A metrology apparatus as claimed in any of clauses 44 to 61, wherein said solid high harmonic generation medium comprises a configured solid high harmonic generation medium, being configured to shape the beam of said second radiation.

63. A metrology apparatus as claimed in clause 62, wherein the configured solid high harmonic generation medium comprises an axicon shape; and concentric circular grooves on the output surface such that a focus of said first radiation and a focus of said second radiation overlap.

64. A metrology apparatus as claimed in clause 62, wherein said concentric circular grooves comprise a Fresnel spacing arrangement.

65. A metrology apparatus as claimed in clause 62, wherein said concentric circular grooves are equally spaced apart.

66. A metrology apparatus as claimed in clause 62, wherein said configured solid high harmonic generation medium is configured such that it has a curved input surface and curved output surface, and such that refraction of the first radiation at the curved input surface, and refraction of the second radiation at the curved output surface, impart a substantially flat-top illumination profile on said second radiation 67. A metrology apparatus as claimed in any of clauses 44 to 66, wherein at least some harmonics of said second radiation comprise wavelengths shorter than 100 nm.
68. A metrology apparatus as claimed in any of clauses 44 to 66, wherein at least some harmonics of said second radiation comprise wavelengths shorter than 70 nm.
69. A metrology apparatus as claimed in any of clauses 44 to 66, wherein at least some harmonics of said second radiation comprise wavelengths shorter than 50 nm.
70. A metrology method for measuring a target formed on a substrate by a lithographic process comprising:

exciting a solid high harmonic generation medium with first radiation, to generate second radiation via a high harmonic generation process from an output surface of the solid high harmonic generation medium; exciting a gas high harmonic generation medium with said first radiation and said second radiation to generate third radiation via a high harmonic generation process; and detecting said third radiation, at least a portion of which having been scattered by said target.

71. A metrology method as claimed in clause 70, comprising focusing a beam of said first radiation at a focal plane on or near the gas high harmonic generation.
72. A metrology method as claimed in clause 71, wherein said focal plane is located within three Rayleigh ranges of said gas high harmonic generation medium.
73. A metrology method as claimed in clause 71 or 72, wherein the solid high harmonic generation medium is located between three and ten Rayleigh ranges before said focal plane.
74. A metrology method as claimed in clause 71, 72 or 73, comprising focusing said second radiation at or near said focal plane.
75. A metrology method as claimed in any of clauses 70 to 74, wherein said second radiation comprises second harmonic radiation.
76. A metrology method as claimed in any of clauses 70 to 75, wherein said second radiation comprises third harmonic radiation.
77. A metrology method as claimed in any of clauses 70 to 76, comprising tilting the solid high harmonic generation medium so as to control of the effective thickness or path length of the solid high harmonic generation medium in a propagation direction of the first radiation.
78. A metrology method as claimed in any of clauses 70 to 77, wherein said the solid high harmonic generation medium comprises a varying thickness along a direction perpendicular to said propagation direction of the first radiation, and laterally translating the solid high harmonic generation medium to control of the effective thickness or path length of the solid high harmonic generation medium in a propagation direction of the first radiation.

79. A metrology method as claimed in any of clauses 70 to 78, wherein said the solid high harmonic generation medium comprises a reflective solid high harmonic generation medium.
80. A metrology method as claimed in clause 79, wherein the reflective solid high harmonic generation medium comprises a separate reflective layer and high harmonic generation layer.
81. A metrology method as claimed in clause 79, wherein the reflective solid high harmonic generation medium comprises a reflective high harmonic generation layer having high harmonic generation material integrated in a reflective layer.
82. A metrology method as claimed in clause 80 or 81, comprising optimizing the thickness of the high harmonic generation layer for synchronization of the first radiation and second radiation.
83. A metrology method as claimed in any of clauses 70 to 82, wherein said at least one solid high harmonic generation medium comprises a first solid high harmonic generation medium and a second solid high harmonic generation medium: and the method comprises:

exciting the first solid high harmonic generation medium with said first radiation to generate second harmonic second radiation; and exciting the second solid high harmonic generation medium with at least said second harmonic second radiation to generate third harmonic second radiation; and exciting the gas high harmonic generation medium with at least the first radiation and third harmonic second radiation.

84. A metrology method as claimed in clause 83, wherein said first solid high harmonic generation medium comprises a nonlinear crystal solid high harmonic generation medium.
85. A metrology method as claimed in clause 83 or 84, wherein said first solid high harmonic generation medium and second solid high harmonic generation medium are comprised within an interferometer arrangement and the method comprises:

separating said third harmonic second radiation from the first radiation and second harmonic second radiation such that said first radiation and second harmonic second radiation is directed to a first interferometer arm and the third harmonic second radiation is directed to a second interferometer arm; imposing a delay in one of both of said first and second interferometer arms to compensate for any delay between said third harmonic second radiation with respect to said first radiation and second harmonic second radiation; and recombining said third harmonic second radiation with said first radiation and second harmonic second radiation.

86. A metrology method as claimed in any of clauses 70 to 86, wherein the solid HHG material has a crystal symmetry suitable for generating a second harmonic.
87. A metrology method as claimed in any of clauses 70 to 86, wherein said solid high harmonic generation medium comprises a dielectric grating.
88. A metrology method as claimed in any of clauses 70 to 87, comprising shaping the beam of said second radiation using said solid high harmonic generation medium.
89. A metrology method as claimed in clause 88, wherein the solid high harmonic generation medium comprises an axicon shape; and concentric circular grooves on the output surface such that a focus of said first radiation and a focus of said second radiation overlap.
90. A metrology method as claimed in clause 88, wherein said concentric circular grooves comprise a Fresnel spacing arrangement.

91. A metrology method as claimed in clause 88, wherein said concentric circular grooves are equally spaced apart.
92. A metrology method as claimed in clause 88, comprising imparting a substantially flat-top illumination profile on said second radiation via said solid high harmonic generation medium, the solid high harmonic generation medium being configured such that it has a curved input surface and curved output surface, and such that refraction of the first radiation at the curved input surface, and refraction of the second radiation at the curved output surface, impart the substantially flat-top illumination profile on said second radiation.
93. A metrology method as claimed in any of clauses 70 to 92, wherein at least some harmonics of said second radiation comprise wavelengths shorter than 100 nm.
94. A metrology method as claimed in any of clauses 70 to 92, wherein at least some harmonics of said second radiation comprise wavelengths shorter than 70 nm.
95. A metrology method as claimed in any of clauses 70 to 92, wherein at least some harmonics of said second radiation comprise wavelengths shorter than 50 nm.
96. A configured solid high harmonic generation medium comprises an input surface operable to receive a first radiation; and an output surface operable to emit a high harmonic second radiation resulting from excitation by the first radiation, wherein the configured solid high harmonic generation medium is configured to shape beam of the second radiation and/or separate the first radiation and the second radiation.
97. A configured solid high harmonic generation medium as claimed in clause 96, wherein the configured solid high harmonic generation medium is shaped operable to refract the first radiation away from an optical axis of the configured solid high harmonic generation medium.
98. A configured solid high harmonic generation medium as claimed in clause 97, wherein the configured solid high harmonic generation medium comprises compensating grooves on the output surface being operable to diffract the second radiation substantially along the optical axis.
99. A configured solid high harmonic generation medium as claimed in clause 96 or 97, wherein the configured solid high harmonic generation medium comprises a grating structure on the output surface being operable to impose a phase modulation on the second radiation.
100. A configured solid high harmonic generation medium as claimed in clause 96 or 97, wherein both the input surface and the output surface are curved and are configured such that refraction of the first radiation at the input surface, and refraction of the second radiation at the output surface, impart a substantially flat-top illumination profile on the second radiation.
101. A configured solid high harmonic generation medium as claimed in clause 96 or 97, comprising an axicon shape operable to impart an annular profile onto first radiation; and concentric circular grooves on the output surface such that the second radiation generated is focused on and/or propagates substantially along an optical axis of the configured solid high harmonic generation medium.
102. A high harmonic generation source comprising configured a solid high harmonic generation medium according to any of clauses 96 to 101.
103. A metrology apparatus comprising a high harmonic generation source according to clause 102.
104. A metrology apparatus comprising a configured a solid high harmonic generation medium according to any of clauses 96 to 101.
105. A lithographic cell comprising a high harmonic generation source according to clause 102.
106. A lithographic cell comprising a metrology apparatus according to clause 104.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range below 0.01 nm or between 0.01 nm and 10 nm, or optionally between 0.01 nm and 0.5 nm, or optionally between 0.01 nm and 0.1 nm, for metrology measurements.

While specific embodiments have been described above, it will be appreciated that one or more of the features in one embodiment may also be present in a different embodiment and that features in two or more different embodiments may also be combined.

The invention claimed is:

1. A metrology apparatus comprising:
a radiation source operable to provide first radiation;
at least one solid high harmonic generation medium being configured to receive and be excited by the first radiation to generate second radiation via a high harmonic generation process from an output surface of the solid high harmonic generation medium;
a gas source configured to emit a gas high harmonic generation medium, the gas high harmonic generation medium being configured to receive the first radiation and the second radiation to generate third radiation via a high harmonic generation process, wherein the at least one solid high harmonic generation medium is located between the radiation source and the gas high harmonic generation medium, wherein the second radiation comprises second or third harmonic radiation; and
a detection arrangement operable to detect the third radiation, at least a portion of which having been scattered by a target.

2. The metrology apparatus of claim 1, wherein the gas high harmonic generation medium is located at or near a focal plane of a beam of the first radiation.

3. The metrology apparatus of claim 2, operable such that the second radiation is substantially focused at or near the focal plane.

4. The metrology apparatus of claim 1, wherein the solid high harmonic generation medium is tiltably mounted so as to provide a control of an effective thickness or path length of the solid high harmonic generation medium in a propagation direction of the first radiation.

5. The metrology apparatus of claim 1, wherein the solid high harmonic generation medium comprises a varying thickness along a direction perpendicular to the propagation direction of the first radiation, and is laterally translatable.

6. The metrology apparatus of claim 1, wherein the solid high harmonic generation medium comprises a reflective solid high harmonic generation medium, wherein optionally the reflective solid high harmonic generation medium comprises a separate reflective layer and high harmonic generation layer.

7. The metrology apparatus of claim 1, wherein the at least one solid high harmonic generation medium comprises:
a first solid high harmonic generation medium for receiving the first radiation and generating second harmonic second radiation; and
a second solid high harmonic generation medium for receiving at least the second harmonic second radiation and generating third harmonic second radiation for exciting the gas high harmonic generation medium.

8. The metrology apparatus of claim 1, wherein the solid high harmonic generation medium comprises a dielectric grating.

9. The metrology apparatus of claim 1, wherein the solid high harmonic generation medium comprises a configured solid high harmonic generation medium, being configured to shape a beam of the second radiation.

10. A metrology method comprising:
exciting a solid high harmonic generation medium with first radiation, to generate second radiation via a high harmonic generation process from an output surface of the solid high harmonic generation medium;
exciting a gas high harmonic generation medium with the first radiation and the second radiation to generate third radiation via a high harmonic generation process, wherein the second radiation comprises second or third harmonic radiation; and
detecting the third radiation, at least a portion of which having been scattered by the target.

11. The metrology method of claim 10, further comprising focusing a beam of the first radiation at a focal plane on or near the gas high harmonic generation.

12. The metrology method of claim 10, further comprising focusing the second radiation at or near a focal plane.

13. The metrology method of claim 10, further comprising tilting the solid high harmonic generation medium so as to control of an effective thickness or path length of the solid high harmonic generation medium in a propagation direction of the first radiation.

14. The metrology method of claim 10, further comprising shaping a beam of the second radiation using the solid high harmonic generation medium.

* * * * *

UNITED STATES PATENT AND TRADEMARK OFFICE
CERTIFICATE OF CORRECTION

PATENT NO. : 12,411,421 B2
APPLICATION NO. : 18/253734
DATED : September 9, 2025
INVENTOR(S) : Kraus et al.

Page 1 of 1

It is certified that error appears in the above-identified patent and that said Letters Patent is hereby corrected as shown below:

In the Specification

In Column 27, Line 40, delete "ifs" and replace with --1 fs--.

Signed and Sealed this
Twenty-first Day of October, 2025

John A. Squires
*Director of the United States Patent and Trademark Office*